US008674590B2

(12) United States Patent
Yamada

(10) Patent No.: US 8,674,590 B2
(45) Date of Patent: Mar. 18, 2014

(54) VIBRATING PIECE SUBSTRATE AND TUNING-FORK VIBRATING PIECE

(75) Inventor: Yoshiyuki Yamada, Minowa (JP)

(73) Assignee: Seiko Epson Corporation (JP)

( * ) Notice: Subject to any disclaimer, the term of this patent is extended or adjusted under 35 U.S.C. 154(b) by 510 days.

(21) Appl. No.: 13/005,162

(22) Filed: Jan. 12, 2011

(65) Prior Publication Data

US 2011/0187232 A1 Aug. 4, 2011

(30) Foreign Application Priority Data

Feb. 1, 2010 (JP) .................................. 2010-020004

(51) Int. Cl.
*H01L 41/08* (2006.01)
*H03H 9/19* (2006.01)
*H03H 9/215* (2006.01)

(52) U.S. Cl.
CPC .................................. *H03H 9/215* (2013.01)
USPC ........................................................ 310/370

(58) Field of Classification Search
CPC ........................................................ G04F 5/06
USPC .......................................................... 310/370
See application file for complete search history.

(56) References Cited

U.S. PATENT DOCUMENTS

| 6,686,219 | B2 * | 2/2004 | Aratake et al. .................. 438/50 |
| 7,518,291 | B2 * | 4/2009 | Tanaya ........................... 310/348 |
| 8,089,200 | B2 * | 1/2012 | Kawahara ...................... 310/344 |
| 8,093,787 | B2 * | 1/2012 | Ichikawa ....................... 310/370 |
| 8,182,703 | B2 * | 5/2012 | Yamada et al. .................... 216/2 |
| 8,303,755 | B2 * | 11/2012 | Ichikawa et al. .............. 156/257 |
| 8,341,814 | B2 * | 1/2013 | Yoshimatsu .................. 29/25.35 |
| 8,347,719 | B2 * | 1/2013 | Ichikawa .................... 73/504.16 |
| 8,382,995 | B2 * | 2/2013 | Ichikawa et al. ................... 216/2 |
| 8,429,800 | B2 * | 4/2013 | Kawahara et al. ........... 29/25.35 |
| 2009/0015106 | A1 * | 1/2009 | Tanaya .......................... 310/344 |
| 2009/0174286 | A1 | 7/2009 | Yoshimatsu et al. |
| 2012/0043859 | A1 * | 2/2012 | Ichikawa et al. .............. 310/344 |

FOREIGN PATENT DOCUMENTS

| GB | 2 147 456 | | 5/1985 |
| JP | 60-070811 | | 4/1985 |
| JP | 2008-177723 | | 7/2008 |
| JP | 2008-178021 | | 7/2008 |
| JP | 2008177723 A | * | 7/2008 |
| JP | 2009-150678 | | 7/2009 |
| JP | 2009-165006 A | | 7/2009 |
| JP | 2012054699 A | * | 3/2012 |

* cited by examiner

*Primary Examiner* — J. San Martin
(74) *Attorney, Agent, or Firm* — Harness, Dickey & Pierce, P.L.C.

(57) ABSTRACT

A vibrating piece substrate includes: a plurality of tuning-fork vibrating pieces each having a base portion, and vibration arm portions and support arm portions extending from the base portion; a frame portion; and a plurality of linking portions connecting the frame portion and the plurality of tuning-fork vibrating pieces, wherein the support arm portions extend in the same direction as the direction in which the vibration arm portions extend, and the support arm portions have a length smaller than the vibration arm portions, the tuning-fork vibrating pieces are arranged such that the vibration arm portions of adjacent tuning-fork vibrating pieces sandwich the region of a portion of the frame portion therebetween, measurement pads are formed in the region of the frame portion sandwiched between the vibration arm portions, and wiring lines are formed in the linking portions to provide electric conduction between the tuning-fork vibrating pieces and the measurement pads.

6 Claims, 14 Drawing Sheets

SIZE A

| | POSITION OF MEASUREMENT PAD 40a | POSITION OF MEASUREMENT PAD 40b | NUMBER OF VIBRATING PIECES | RATIO OF NUMBER OF VIBRATING PIECES |
|---|---|---|---|---|
| PATTERN 1 | SUPPORT ARM END (FRONT) | SUPPORT ARM END (FRONT) | 1170 | 1.17 |
| PATTERN 2 | SUPPORT ARM END (REAR) | SUPPORT ARM END (REAR) | 1170 | 1.17 |
| PATTERN 3 | BASE END | VIBRATION ARM END | 1080 | 1.08 |
| PATTERN 4 | BASE END | BASE END | 1000 | 1.00 |

FIG. 6A

SIZE B

| | POSITION OF MEASUREMENT PAD 40a | POSITION OF MEASUREMENT PAD 40b | NUMBER OF VIBRATING PIECES | RATIO OF NUMBER OF VIBRATING PIECES |
|---|---|---|---|---|
| PATTERN 1 | SUPPORT ARM END (FRONT) | SUPPORT ARM END (FRONT) | 2066 | 1.33 |
| PATTERN 2 | SUPPORT ARM END (REAR) | SUPPORT ARM END (REAR) | 2066 | 1.33 |
| PATTERN 3 | BASE END | VIBRATION ARM END | 2054 | 1.27 |
| PATTERN 4 | BASE END | BASE END | 2000 | 1.00 |

FIG. 6B

SIZE C

| | POSITION OF MEASUREMENT PAD 40a | POSITION OF MEASUREMENT PAD 40b | NUMBER OF VIBRATING PIECES | RATIO OF NUMBER OF VIBRATING PIECES |
|---|---|---|---|---|
| PATTERN 1 | SUPPORT ARM END (FRONT) | SUPPORT ARM END (FRONT) | 4500 | 1.50 |
| PATTERN 2 | SUPPORT ARM END (REAR) | SUPPORT ARM END (REAR) | 4500 | 1.50 |
| PATTERN 3 | BASE END | VIBRATION ARM END | 4050 | 1.35 |
| PATTERN 4 | BASE END | BASE END | 3000 | 1.00 |

FIG. 6C

VIBRATING PIECE SUBSTRATE AND TUNING-FORK VIBRATING PIECE

BACKGROUND

1. Technical Field

The present invention relates to a vibrating piece substrate and a tuning-fork vibrating piece, and in particular, to a vibrating piece substrate and a tuning-fork vibrating piece in which a pad for the measurement of characteristics is provided.

2. Related Art

In the related art, various vibrating pieces are used in an electronic apparatus as a clock signal source. Of the vibrating pieces, in many cases, a tuning-fork vibrating piece is used which is easy to manufacture and excellent in frequency-temperature characteristics. A method of manufacturing a tuning-fork vibrating piece is known in which a substrate (wafer) formed of a piezoelectric material, such as quartz, is etched in the form of the base portions of a plurality of tuning-fork vibrating pieces being connected to a frame, and the base portions of the respective tuning-fork vibrating pieces are folded and cut off from the frame (for example, see JP-A-2008-178021).

However, there are many cases where a cut mark is generated in a portion where the tuning-fork vibrating piece is folded and cut off. When a tuning-fork vibrating piece with a cut mark is accommodated in a package, the folded and cut portion comes into contact with the package, and intensive vibration or impact is applied from the outside. For this reason, quartz cracking may occur from the cut mark and a support arm or the like may be damaged. In order to solve such problems, a folding and cutting portion is provided in the support arm, not in the base portion (for example, see JP-A-2008-177723 and JP-A-60-070811).

In the related art, the characteristics, such as a frequency and a CI (Crystal Impedance) value, were measured before the respective tuning-fork vibrating pieces were folded and cut off. Measurement pads with which a measurement probe comes into contact may be arranged in the base portion if the area of the base portion is comparatively large (for example, see JP-A-2009-150678). In recent years, with the reduction in size of the tuning-fork vibrating piece, the area of the base portion decreases, such that the measurement pads may not be arranged in the base portion. In measuring the characteristics of the tuning-fork vibrating piece, the measurement probe is in direct contact with the measurement pads. In this case, it is necessary that the measurement pads have an area in a range of about 0.02 to 0.04 mm$^2$ so as to maintain the strength of the measurement pads, and it is impossible to further reduce the area of each of the measurement pads. For this reason, in recent years, the measurement pads are provided in a frame portion close to the base portion (for example, see JP-A-2008-178021).

However, if the measurement pads are provided in the frame portion near the base portion, the measurement pads occupy a space, causing a decrease in the number of tuning-fork vibrating pieces per vibrating piece substrate.

SUMMARY

An advantage of some aspects of the invention is that it provides a vibrating piece substrate and a tuning-fork vibrating piece in which, when measurement pads are provided in a vibrating piece substrate to measure the characteristics of a plurality of tuning-fork vibrating pieces formed in the vibrating piece substrate, the measurement pads are arranged so as to increase the number of tuning-fork vibrating pieces per vibrating piece substrate.

Some aspects of the invention can solve at least a part of the problems described above and the invention can be implemented as the following forms or application examples.

APPLICATION EXAMPLE 1

This application example of the invention provides a vibrating piece substrate. The vibrating piece substrate includes a plurality of tuning-fork vibrating pieces each having a base portion, and vibration arm portions and support arm portions extending from the base portion, a frame portion, and a plurality of linking portions connecting the frame portion and the plurality of tuning-fork vibrating pieces. The support arm portions extend in the same direction as the direction in which the vibration arm portions extend, and the support arm portions have a length smaller than the vibration arm portions. The tuning-fork vibrating pieces are arranged such that the vibration arm portions of adjacent tuning-fork vibrating pieces sandwich the region of a portion of the frame portion therebetween. Measurement pads are formed in the region of the frame portion sandwiched between the vibration arm portions. Wiring lines are formed in the linking portions to provide electric conduction between the tuning-fork vibrating pieces and the measurement pads.

With this configuration, the measurement pads can be formed in an unused region of the frame portion sandwiched between the vibration arm portions. Therefore, it is possible to increase the number of tuning-fork vibrating pieces per vibrating piece substrate.

APPLICATION EXAMPLE 2

In the vibrating piece substrate according to the application example 1, in the region of the frame portion sandwiched between the vibration arm portions, two measurement pads may be arranged in parallel in the direction in which the the vibration arm portions extend.

With this configuration, even when two measurement pads are arranged in parallel in a direction perpendicular to the direction in which the vibration arm portions extend, the measurement pads do not occupy a width in the direction perpendicular to the direction in which the vibration arm portions extend, increasing the number of tuning-fork vibrating pieces per vibrating piece substrate.

APPLICATION EXAMPLE 3

In the vibrating piece substrate according to the application example 1 or 2, the tuning-fork vibrating pieces, the frame portion, and the linking portions may be formed by processing two surfaces facing in opposing directions, and a surface on which thin films serving as a weight are formed may be different from a surface on which the measurement pads and the wiring lines are formed.

With this configuration, when radioactive rays are irradiated onto the vibrating arm portions in forming the thin films serving as a weight, it is possible to allow a probe to carry out measurement accurately without being affected by the radioactive rays, making it possible to manufacture tuning-fork vibrating pieces with stable quality.

APPLICATION EXAMPLE 4

This application example of the invention provides a tuning-fork vibrating piece which is folded and cut off from the vibrating piece substrate according to any one of the application examples 1 to 3 at the linking portions.

With this configuration, even when measurement pads for characteristic inspection are provided on the vibrating piece substrate, it is possible to increase the number of tuning-fork vibrating pieces per vibrating piece substrate and to reduce manufacturing cost of one tuning-fork vibrating piece.

APPLICATION EXAMPLE 5

This application example of the invention provides a tuning-fork vibrating piece. The tuning-fork vibrating piece includes a base portion, and vibration arm portions and support arm portions extending from the base portion. The support arm portions have folded and cut marks which are marks formed by folding and cutting off portions connected to a frame portion of a vibrating piece substrate. Wiring lines for the measurement of characteristics before folding and cutting are formed in portions extending to the folded and cut marks from the support arm portions.

With this configuration, electric conduction can be provided between the tuning-fork vibrating piece and the frame portion through the linking portion before the tuning-fork vibrating piece is folded and cut off. Therefore, the tuning-fork vibrating piece can be folded and cut off after the characteristics of the tuning-fork vibrating piece are measured.

BRIEF DESCRIPTION OF THE DRAWINGS

The invention will be described with reference to the accompanying drawings, wherein like numbers reference like elements.

FIGS. 6A to 6C are comparison tables of the number of tuning-fork vibrating pieces in terms of the size of a tuning-fork vibrating piece and in terms of the arrangement position of a measurement pad.

DESCRIPTION OF EXEMPLARY EMBODIMENTS

Hereinafter, an embodiment of the invention will be described in detail with reference to the accompanying drawings.

Figure 1:
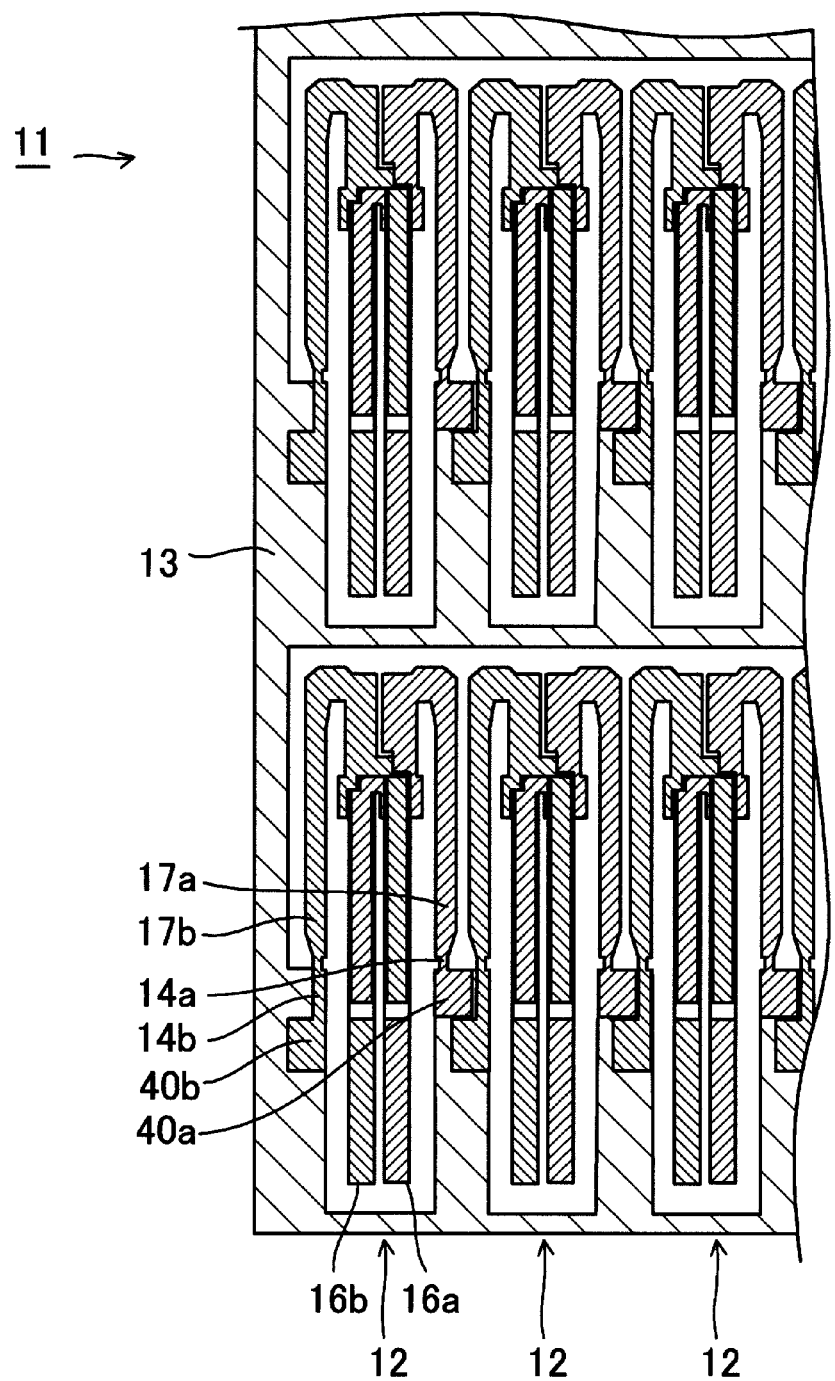
FIG. 1 is a diagram showing a portion of the surface of a vibrating piece substrate according to an embodiment of the invention.

FIG. 1 is a diagram showing a portion of one surface (hereinafter, referred to as "front surface") of a vibrating piece substrate 11 according to an embodiment of the invention. The vibrating piece substrate 11 is a plate-shaped substrate having two surfaces facing in opposing directions and is made of a piezoelectric material, such as quartz. In the vibrating piece substrate 11, a plurality of tuning-fork vibrating pieces 12 are formed by processing the two surfaces in a predetermined shape pattern. As shown in FIG. 1, the vibrating piece substrate 11 includes a frame portion 13, a plurality of tuning-fork vibrating pieces 12, and a plurality of linking portions 14a and 14b which respectively connect the frame portion 13 and a plurality of tuning-fork vibrating pieces 12.

Each of the tuning-fork vibrating pieces 12 includes a base portion 15, and vibration arm portions 16a and 16b and support arm portions 17a and 17b extending from the base portion 15. The vibration arm portions 16a and 16b extend substantially in parallel at a predetermined interval from the base portion 15. The support arm portions 17a and 17b protrude from the base portion 15 in left and right directions and are bent in an L shape, are folded at the bent portions, and extend substantially in parallel along the outer side of the vibration arm portions 16a and 16b. The support arm portions 17a and 17b have a length smaller than the vibration arm portions 16a and 16b. The support arm portions 17a and 17b are fixed to a package (not shown) or the like to support the base portion 15 and the vibration arm portions 16a and 16b.

The tuning-fork vibrating pieces 12 are configured such that the vibration arm portions 16a and 16b of adjacent tuning-fork vibrating pieces 12 sandwich the region of a portion of the frame portion 13 therebetween. In the region of the frame portion 13 sandwiched between the vibration arm portion 16a of the tuning-fork vibrating piece 12 and the vibration arm portion 16b of the tuning-fork vibrating piece 12 adjacent to the relevant tuning-fork vibrating piece 12, measurement pads 40a and 40b are formed to measure the characteristics of the tuning-fork vibrating pieces 12.

The two measurement pads 40a and 40b are arranged in parallel in a longitudinal direction in which the vibration arm portions 16a and 16b extend. As such, the measurement pads 40a and 40b are arranged in parallel in the longitudinal direction, such that the measurement pads 40a and 40b can be arranged in an unused region on the frame portion 13 of the vibrating piece substrate 11. The measurement pads 40a and 40b do not occupy a width compared to a case where the measurement pads are arranged in parallel in a transverse direction (a direction perpendicular to the longitudinal direction in which the vibration arm portions 16a and 16b extend), making it possible to increase the number of tuning-fork vibrating pieces per vibrating piece substrate 11.

Figure 2:
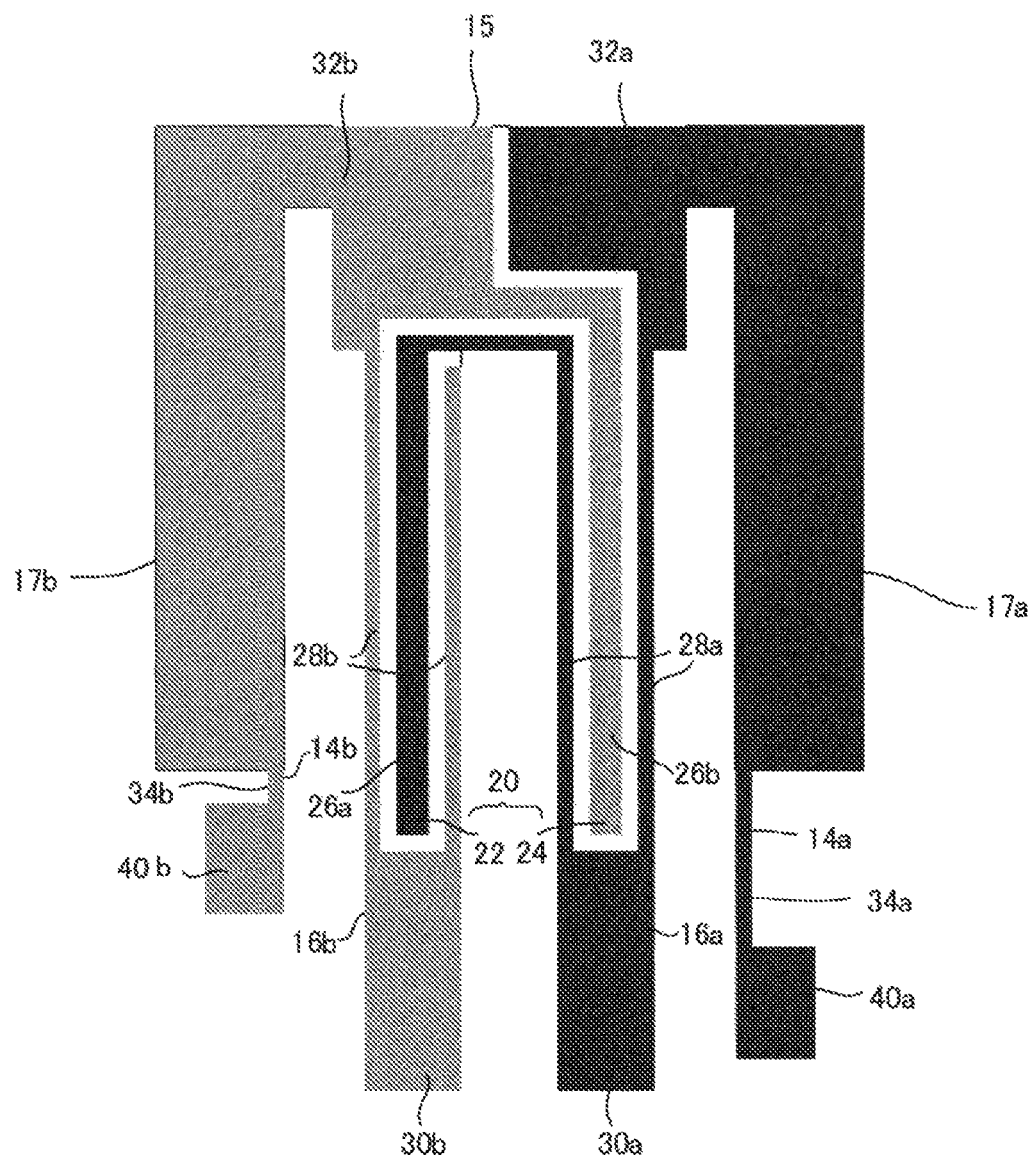
FIG. 2 is a diagram schematically showing an electrode pattern formed on the front surface of a tuning-fork vibrating piece according to the embodiment of the invention.
Figure 3:
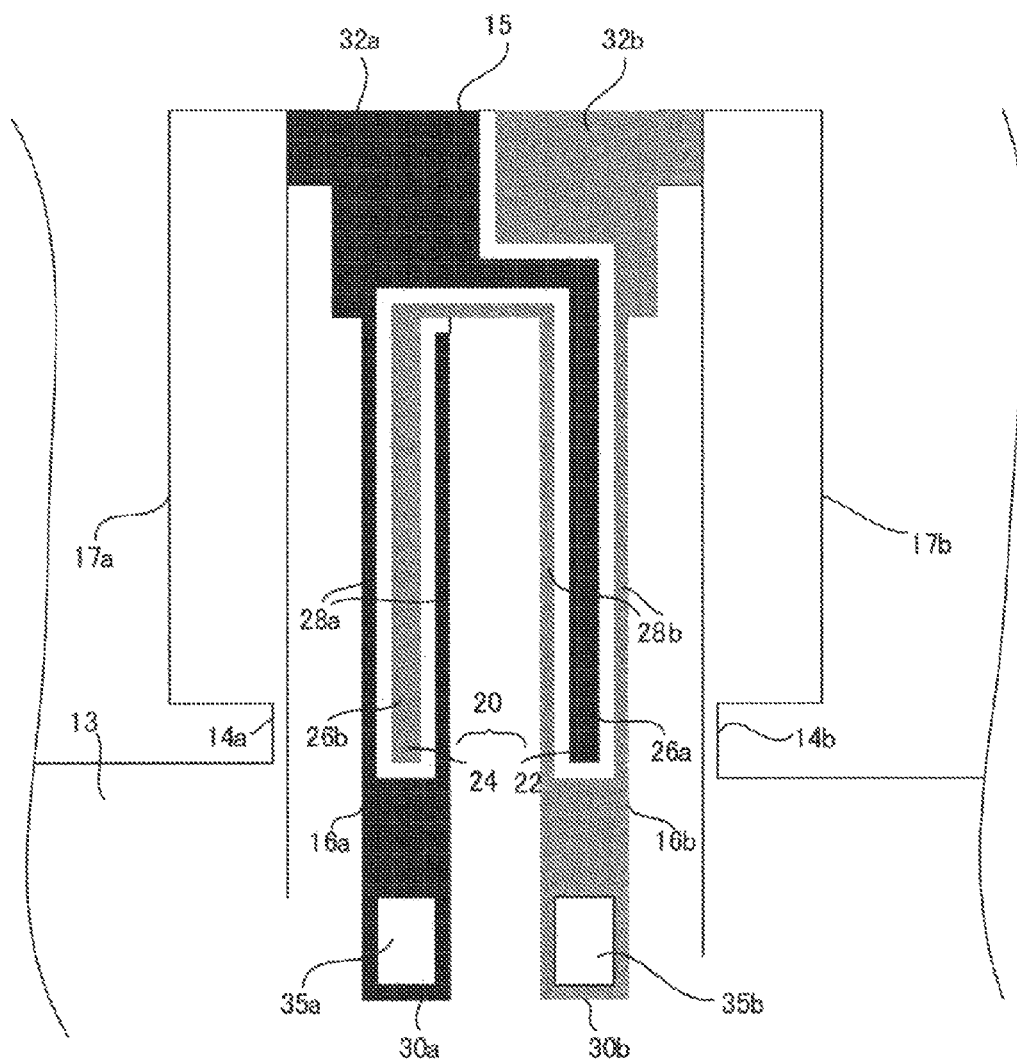
FIG. 3 is a diagram schematically showing an electrode pattern formed on the rear surface of a tuning-fork vibrating piece according to the embodiment of the invention.

Electrode patterns having a predetermined shape are formed on both surfaces of the tuning-fork vibrating piece 12. FIG. 2 is a diagram schematically showing an electrode pattern 20 formed on the front surface of the tuning-fork vibrating piece 12. FIG. 3 is a diagram schematically showing an electrode pattern 20 formed on the rear surface of the tuning-fork vibrating piece 12. The electrode pattern 20 includes a first electrode 22 and a second electrode 24. The first electrode 22 and the second electrode 24 are electrically separated from each other to be connected to different potentials. The electrode pattern 20 is formed of, for example, a Cr (chromium) layer with high adhesiveness to quartz and an overlying Au (gold) layer which has low electrical resistance and is rarely oxidized.

In the vibration arm portion 16b, first excitation electrodes 26a which are driving electrodes are formed on the front and rear surfaces correspondingly. A pair of first excitation electrodes 26a are electrically connected to each other. Second excitation electrodes 28a are formed on both lateral surfaces of the vibration arm portion 16a. A pair of second excitation electrodes 28a are electrically connected to each other through a connection electrode 30a formed at the front end of the vibration arm portion 16a. The first excitation electrodes 26a formed in the vibration arm portion 16b and the second excitation electrodes 28a formed in the vibration arm portion 16a are electrically connected to each other through lead electrodes 32a on the base portion 15. The lead electrodes 32a are formed to reach the front end of the support arm portion 17a. A wiring line 34a is formed in the linking portion 14a to provide electric conduction between the lead electrode 32a and the measurement pad 40a. It is preferable that the linking portion 14a is arranged adjacent to the measurement pad 40a, shortening the length of the wiring line therebetween.

The first electrode 22 is constituted by the first excitation electrodes 26a, the second excitation electrodes 28a, the connection electrodes 30a, the lead electrodes 32a, and the wiring lines 34a which are electrically connected to each other.

Similarly, in the tuning-fork vibrating piece 12, first excitation electrodes 26b, second excitation electrodes 28b, connection electrodes 30b, lead electrodes 32b, and wiring lines 34b are folded with respect to the central axis of the tuning-fork vibrating piece 12 and are provided substantially with the same positional relationship as the first excitation electrodes 26a, the second excitation electrodes 28a, the connection electrodes 30a, the lead electrodes 32a, and the wiring lines 34a, thereby forming the second electrode 24.

Figure 4:
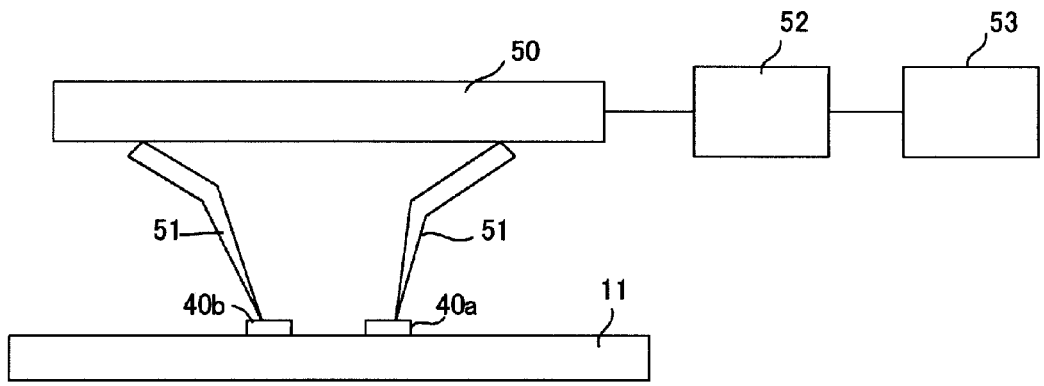
FIG. 4 is a diagram showing a mode in which a probe comes into contact with a measurement pad to measure the characteristics of a tuning-fork vibrating piece according to the embodiment of the invention.

If a probe comes into contact with the measurement pads 40a and 40b, a voltage is applied between the first excitation electrodes 26a and the second excitation electrodes 28a to stretch the lateral surfaces of the vibration arm portions 16a and 16b, such that the vibration arm portions 16a and 16b vibrate. FIG. 4 is a schematic view showing a condition where a probe 51 of a probe card 50 which is connected to a variable frequency oscillator 52 applying an excitation voltage and a modulation signal oscillator 53 supplying a signal for frequency modulation comes into contact with the measurement pads 40a and 40b. A controller (not shown) connected to the probe card 50 detects the vibration of the vibration arm portions 16a and 16b as an electrical signal and calculates characteristic values, such as a frequency.

On the rear surface of the tuning-fork vibrating piece 12, as shown in FIG. 3, no electrode pattern is formed in the support arm portions 17a and 17b and the linking portions 14a and 14b. When it is necessary to adjust the frequency on the basis of the characteristic measurement result of the tuning-fork vibrating piece 12, thin films 35a and 35b serving as a weight are formed on the vibration arm portions 16a and 16b. The measurement pads 40a and 40b are not provided. Other than that, the electrode pattern on the rear surface is the same as that on the front surface. As described above, the wiring lines 34a and 34b and the measurement pads 40a and 40b are formed on the front surface, and the thin films 35a and 35b serving as a weight are formed on the rear surface. Thus, even when radioactive rays are irradiated onto the vibration arm portions 16a and 16b so as to form the thin films 35a and 35b, the probe 51 is not affected by the radioactive rays. Therefore, there is no problem, such as damage to the probe 51, and it is possible to perform measurement accurately and to manufacture the tuning-fork vibrating piece 12 with stable quality.

Figure 5:
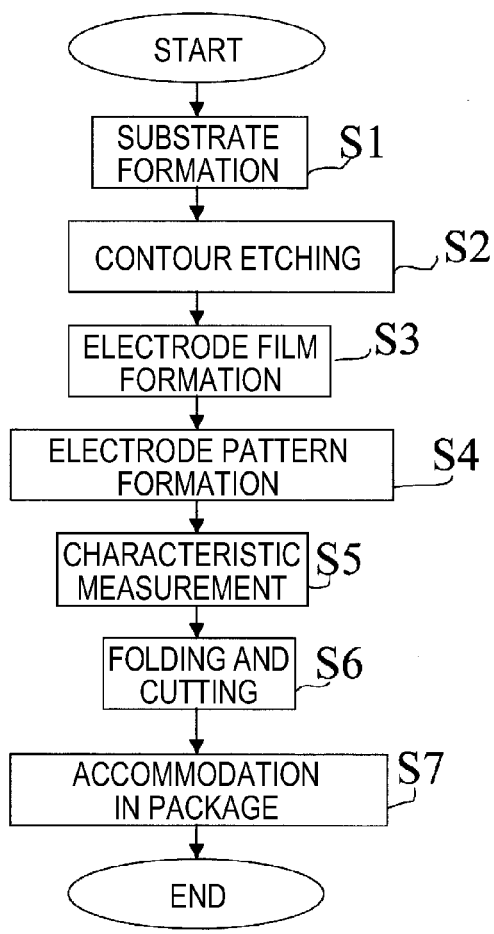
FIG. 5 is a flowchart showing a process for manufacturing a package with a tuning-fork vibrating piece accommodated according to the embodiment of the invention.

Next, a method of manufacturing a package in which the tuning-fork vibrating piece 12 is accommodated will be described with reference to a flowchart of FIG. 5.

First, a piezoelectric material, such as quartz, is processed in a plate shape to form a single substrate (Step S1). Next, contour etching is carried out to form the contour of the tuning-fork vibrating piece 12, the linking portions 14a and 14b, the frame portion 13, and the like (Step S2). Specifically, a photoresist film is formed on the substrate with an electrode pattern formed, and the contour pattern of the tuning-fork vibrating piece 12 and the like is exposed and developed to the photoresist film. Thus, the photoresist film remains on the substrate to conform to the contour of the tuning-fork vibrating piece 12. Contour etching is carried out with the remaining photoresist film as a mask. After contour etching, the photoresist film is removed.

Next, an electrode film which has an upper layer made of Au and a lower layer made of Cr is formed on the front and rear surfaces of the substrate through vapor deposition or sputtering (Step S3). Next, a plurality of electrode patterns of the first excitation electrodes 26a and 26b, the second excitation electrodes 28a and 28b, the lead electrodes 32a and 32b, the connection electrodes 30a and 30b, the measurement pads 40a and 40b, the wiring lines 34a and 34b, and the like on the tuning-fork vibrating pieces 12 are formed on the electrode film in parallel at regular intervals in the transverse and longitudinal directions (Step S4). Specifically, a photoresist film is formed on the electrode film, and the electrode pattern is exposed and developed to the photoresist film, such that the photoresist film remains on the electrode film to conform to the electrode pattern. The electrode film is etched with the remaining photoresist film as a mask, and then the photoresist film is removed.

Next, the probe 51 comes into contact with the measurement pad 40a which is conducted to the support arm portion 17a of each tuning-fork vibrating piece 12 and the measurement pad 40b which is conducted to the support arm portion 17b so as to measure the characteristics of each tuning-fork vibrating piece 12 (Step S5). If necessary, the thin films 35a and 35b serving as a weight may be formed in the vibration arm portions 16a and 16b in accordance with the measurement values. Alternatively, the thin films formed in the vibration arm portions 16a and 16b may be removed through inverse sputtering. When this happens, it is possible to adjust the vibration frequency. Thereafter, if necessary, the characteristics may be measured again and the same process may be repeated.

After the measurement or the adjustment of characteristics ends, the tuning-fork vibrating pieces 12 are folded and cut off from the frame portion 13 at the linking portions 14a and 14b (Step S6). For example, the frame portion 13 is held and the tuning-fork vibrating pieces 12 are pressed while being adsorbed by an adsorber, such that the tuning-fork vibrating pieces 12 are folded and cut off from the frame portion 13. Alternatively, the linking portions 14a and 14b may be cut by laser or the like. Thus, folded and cut marks which are marks after being folded and cut off are formed in the support arm portions 17a and 17b.

Each of the folded and cut tuning-fork vibrating pieces 12 is accommodated in a package (not shown), such as ceramic, and the package is sealed with a cover airtight (Step S7). In the package, a pair of mounting electrodes are formed, and the tuning-fork vibrating piece 12 is placed on the mounting electrodes, and conducted and connected to the mounting electrodes through a conductive adhesive.

FIGS. 6A to 6C are tables showing a comparison example of the number of tuning-fork vibrating pieces 12 from the single vibrating piece substrate 11 in terms of the size of the tuning-fork vibrating piece 12 and the arrangement positions of the measurement pads 40a and 40b.

FIG. 6A shows a comparison example in terms of the arrangement positions of the measurement pads 40a and 40b when the area of the tuning-fork vibrating piece 12 is about 1.56 mm$^2$ (hereinafter, referred to as "size A"). FIG. 6B shows a comparison example in terms of the arrangement positions of the measurement pads 40a and 40b when the width of the tuning-fork vibrating piece 12 is smaller than the size A, 0.78 times the size A (hereinafter, referred to as "size B"). FIG. 6C shows a comparison example in terms of the arrangement example of the measurement pads 40a and 40b when the width of the tuning-fork vibrating piece 12 is smaller than the size B, 0.75 times the size B (hereinafter, referred to as "size C").

In the sizes A, B, and C, a pattern 1 refers to when the measurement pads 40a and 40b are arranged on the front surface of the vibrating piece substrate 11 in the frame portion 13 near the front ends of the support arm portions 17a and 17b. A pattern 2 refers to when the measurement pads 40a and 40b are arranged on the rear surface of the vibrating piece substrate 11 in the frame portion 13 near the front ends of the support arm portions 17a and 17b. A pattern 3 refers to when the measurement pad 40a is arranged in the frame portion 13 near the base portion 15 and the measurement pad 40b is arranged in the frame portion 13 near the front ends of the support arm portions 17a and 17b. A pattern 4 refers to when the measurement pads 40a and 40b are arranged in the frame portion 13 near the base portion 15.

Figure 7:
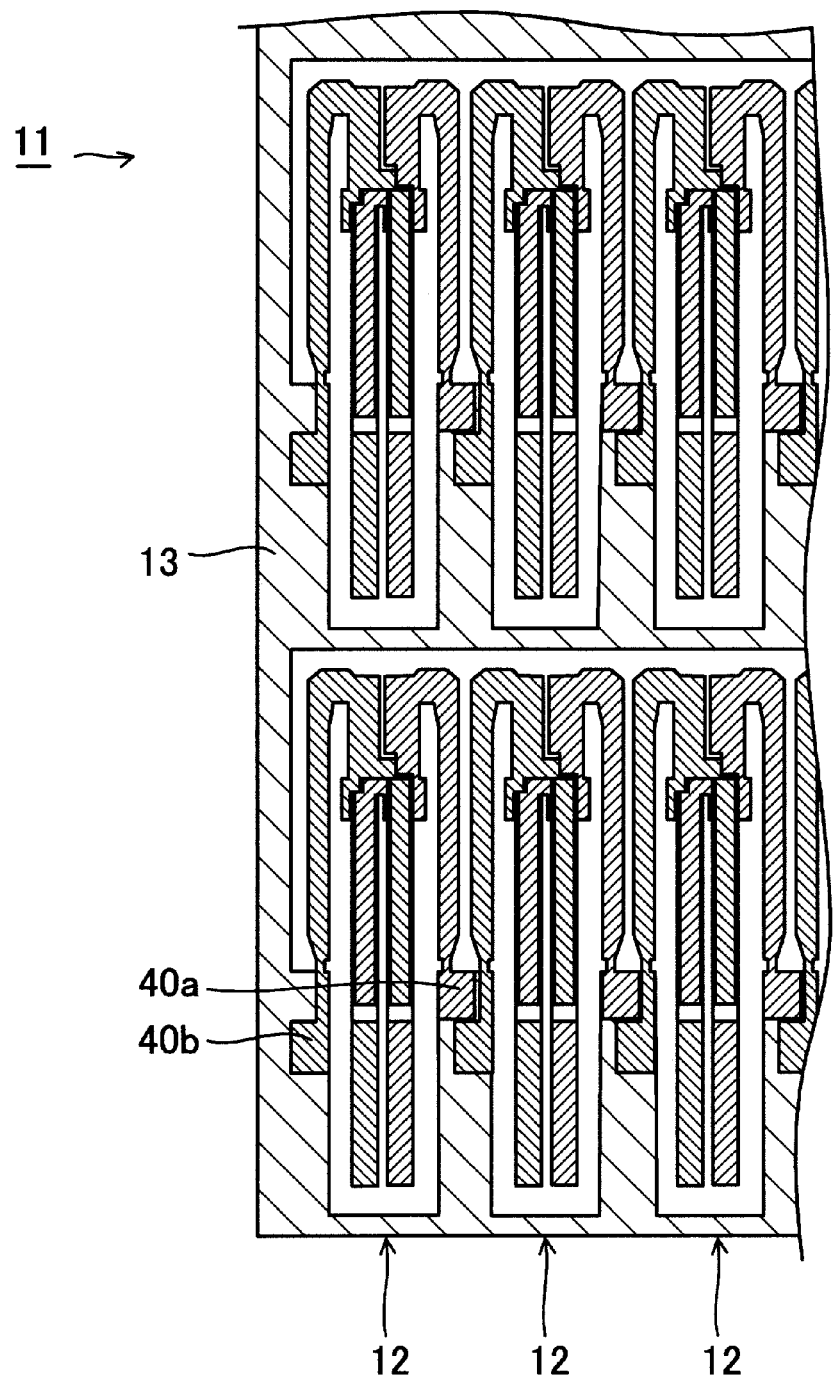
FIG. 7 is a diagram showing a portion of the rear surface of a vibrating piece substrate according to the embodiment of the invention when a tuning-fork vibrating piece is of a size A and the arrangement position of a measurement pad follows a pattern 2.
Figure 8:
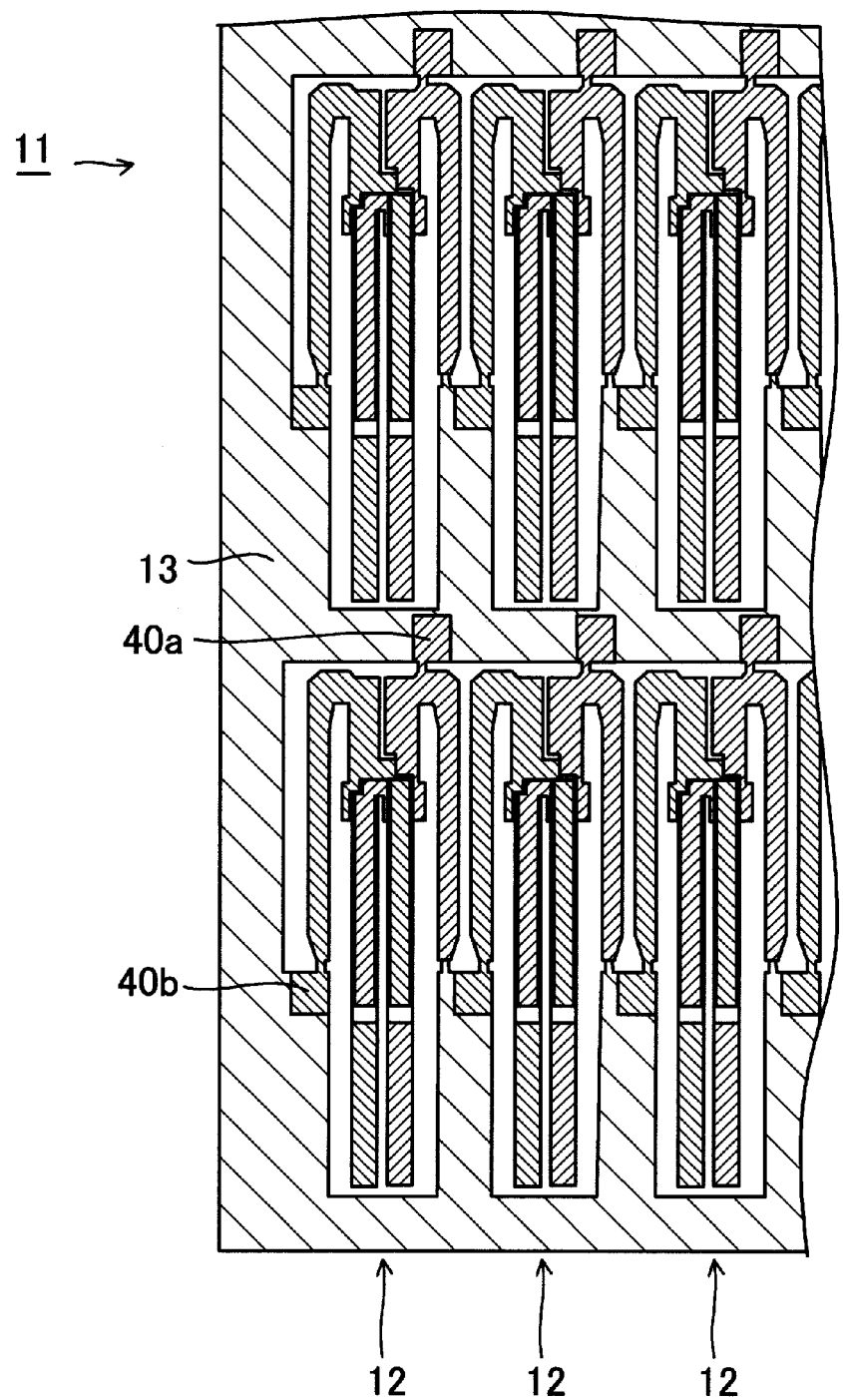
FIG. 8 is a diagram showing a portion of the front surface of a vibrating piece substrate according to the embodiment of the invention when a tuning-fork vibrating piece is of a size A and the arrangement position of a measurement pad follows a pattern 3.
Figure 9:
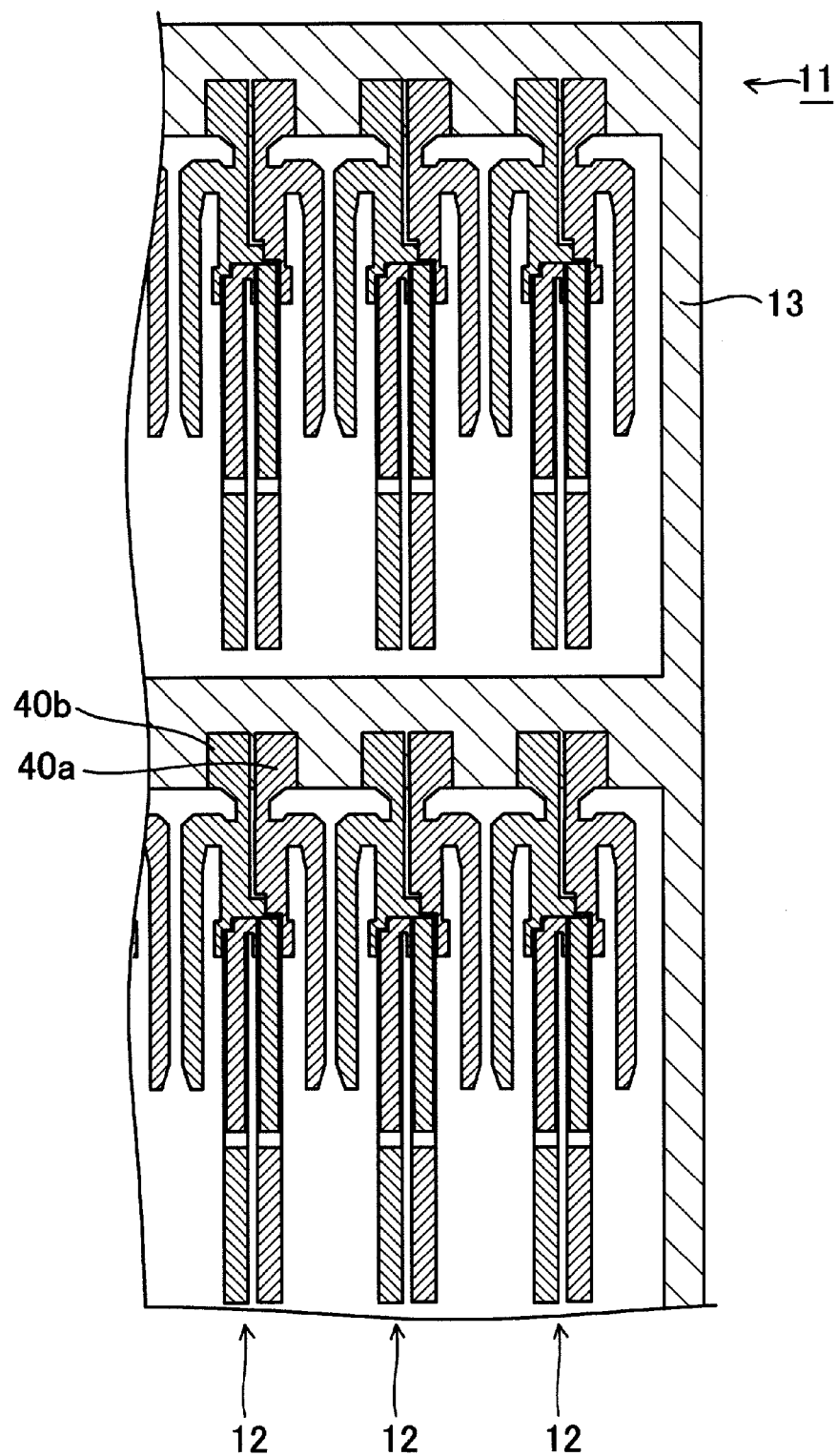
FIG. 9 is a diagram showing a portion of the front surface of a vibrating piece substrate according to the embodiment of the invention when a tuning-fork vibrating piece is of a size A and the arrangement position of a measurement pad follows a pattern 4.
Figure 10:
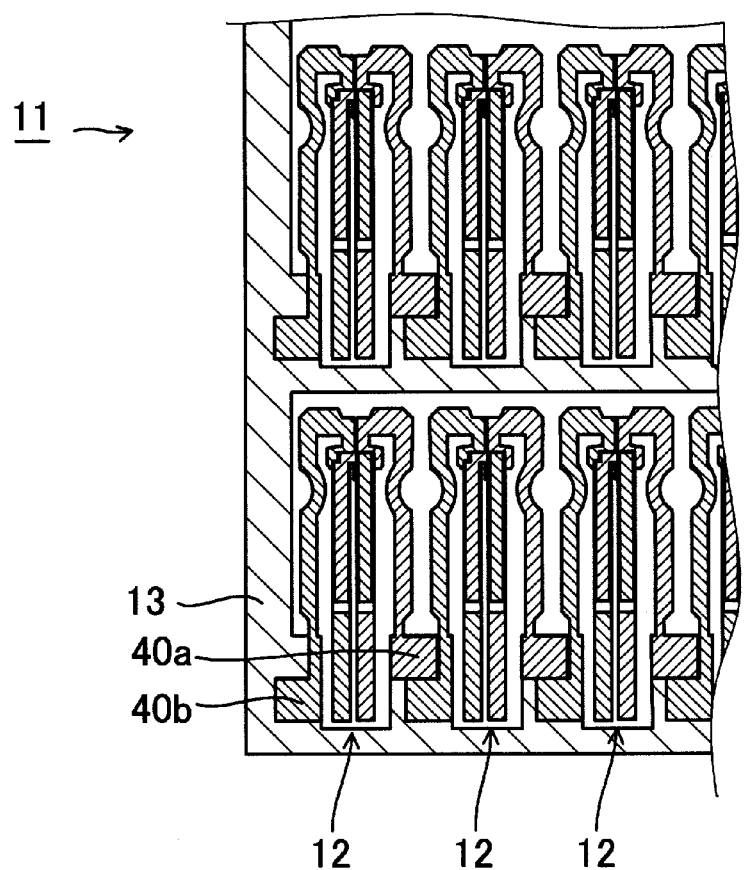
FIG. 10 is a diagram showing a portion of the front surface of a vibrating piece substrate according to the embodiment of the invention when a tuning-fork vibrating piece is of a size B and the arrangement position of a measurement pad follows a pattern 1.
Figure 11:
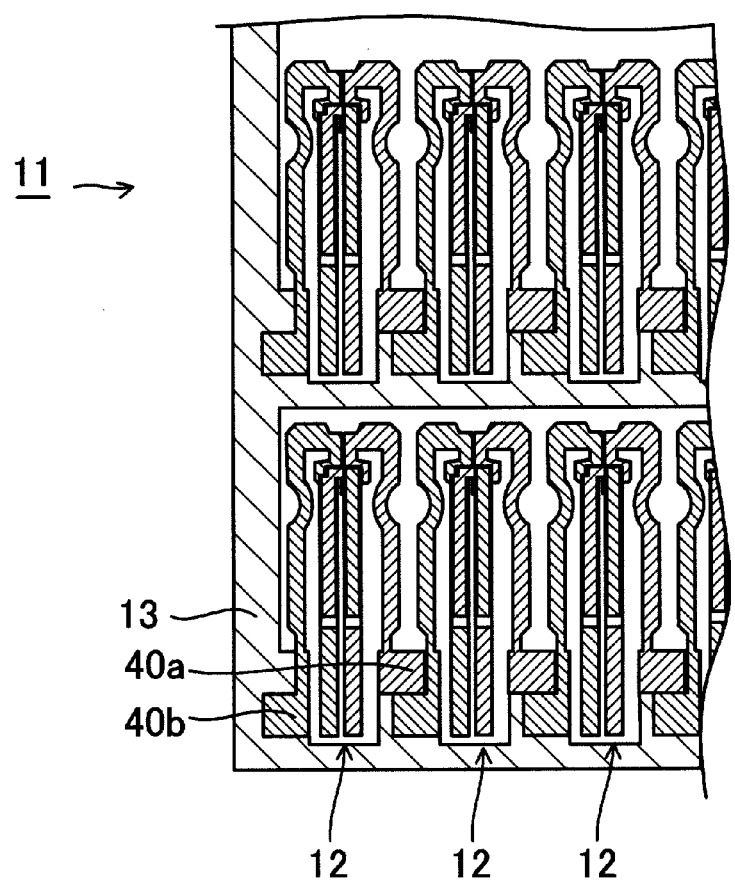
FIG. 11 is a diagram showing a portion of the rear surface of a vibrating piece substrate according to the embodiment of the invention when a tuning-fork vibrating piece is of a size B and the arrangement position of a measurement pad follows a pattern 2.
Figure 12:
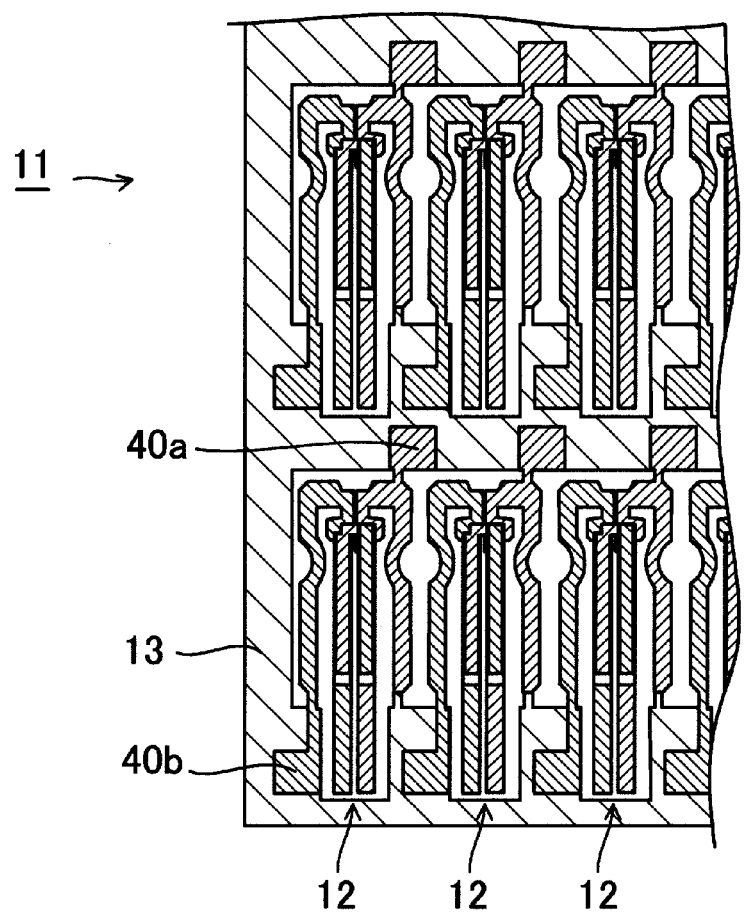
FIG. 12 is a diagram showing a portion of the front surface of a vibrating piece substrate according to the embodiment of the invention when a tuning-fork vibrating piece is of a size B and the arrangement position of a measurement pad follows a pattern 3.
Figure 13:
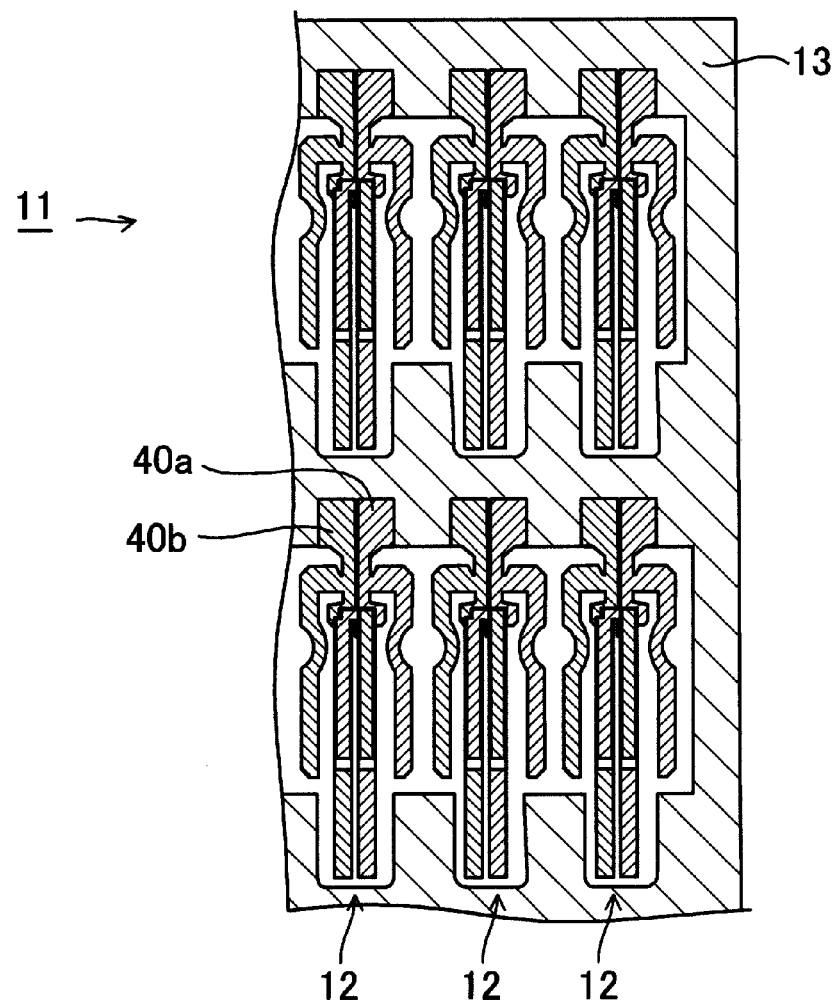
FIG. 13 is a diagram showing a portion of the front surface of a vibrating piece substrate according to the embodiment of the invention when a tuning-fork vibrating piece is of a size B and the arrangement position of a measurement pad follows a pattern 4.
Figure 14:
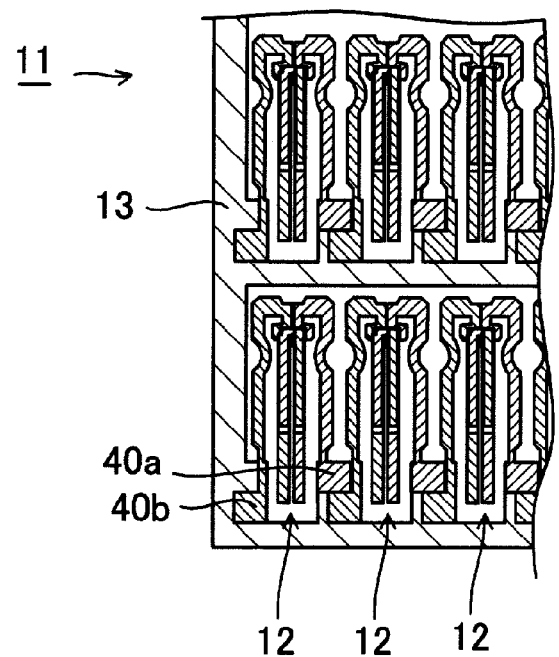
FIG. 14 is a diagram showing a portion of the front surface of a vibrating piece substrate according to the embodiment of the invention when a tuning-fork vibrating piece is of a size C and the arrangement position of a measurement pad follows a pattern 1.
Figure 15:
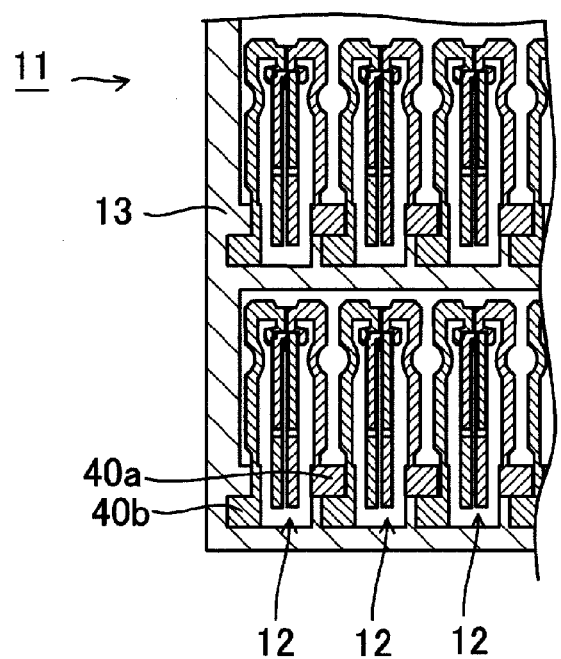
FIG. 15 is a diagram showing a portion of the rear surface of a vibrating piece substrate according to the embodiment of the invention when a tuning-fork vibrating piece is of a size C and the arrangement position of a measurement pad follows a pattern 2.
Figure 16:
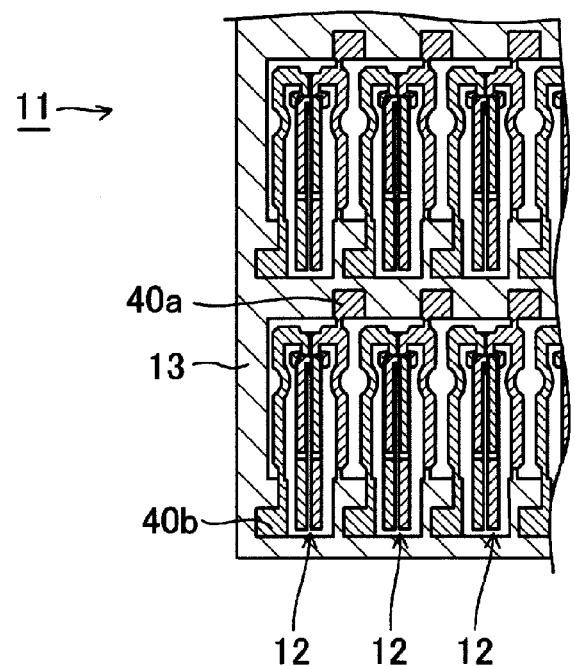
FIG. 16 is a diagram showing a portion of the front surface of a vibrating piece substrate according to the embodiment of the invention when a tuning-fork vibrating piece is of a size C and the arrangement position of a measurement pad follows a pattern 3.
Figure 17:
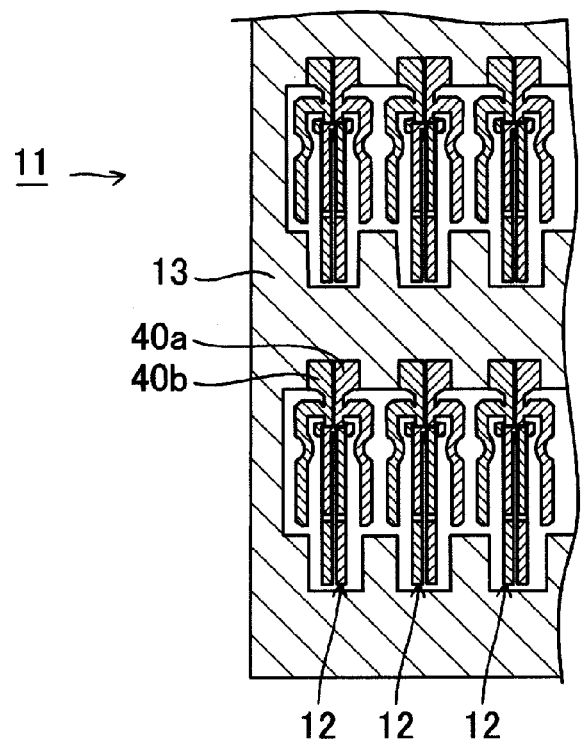
FIG. 17 is a diagram showing a portion of the front surface of a vibrating piece substrate according to the embodiment of the invention when a tuning-fork vibrating piece is of a size C and the arrangement position of a measurement pad follows a pattern 4.

FIG. 1 corresponds to the size A and the pattern 1. FIG. 7 corresponds to the size A and the pattern 2. FIG. 8 corresponds to the size A and the pattern 3. FIG. 9 corresponds to the size A and the pattern 4. FIG. 10 corresponds to the size B and the pattern 1. FIG. 11 corresponds to the size B and the pattern 2. FIG. 12 corresponds to the size B and the pattern 3. FIG. 13 corresponds to the size B and the pattern 4. FIG. 14 corresponds to the size C and the pattern 1. FIG. 15 corresponds to the size C and the pattern 2. FIG. 16 corresponds to the size C and the pattern 3. FIG. 17 corresponds to the size C and the pattern 4. FIGS. 8, 13, and 16 show the rear surface of the vibrating piece substrate 11, and other drawings show the front surface of the vibrating piece substrate 11. The same scale is applied to the drawings.

As shown in FIGS. 6A, 6B, and 6C, regardless of the size of the tuning-fork vibrating piece 12, in the case of the pattern (the patterns 1 and 2) in which the measurement pads 40a and 40b are provided in the frame portion 13 near the front ends of the support arm portions 17a and 17b, the number of tuning-fork vibrating pieces 12 is the largest.

Although in the pattern 2, the surface on which the thin films 35a and 35b serving as a weight is the same as the surface on which the measurement pad 40b is provided, in the pattern 1, the surface on which the thin films 35a and 35b serving as a weight is different from the surface on which the measurement pad 40b is provided. Thus, as described in the foregoing embodiment, in the pattern 1, there is no case where the probe 51 is affected by radioactive rays in forming the thin films 35a and 35b.

As described above, the frame portion 13 and the tuning-fork vibrating piece 12 are linked through the linking portions 14a and 14b, and unlike the related art, the measurement pads 40a and 40b are formed in an unused region of the frame portion 13 sandwiched between the vibration arm portions 16a and 16b, not in the frame portion 13 near the base portion 15. Therefore, it is possible to increase the number of tuning-fork vibrating pieces per vibrating piece substrate 11 and to reduce manufacturing cost per tuning-fork vibrating piece 12.

In the region of the frame portion 13 sandwiched between the vibration arm portions 16a and 16b, the two measurement pads 40a and 40b are arranged in parallel in the longitudinal direction in which the vibration arm portions 16a and 16b extend. Thus, the measurement pads 40a and 40b do not occupy a width in the transverse direction perpendicular to the longitudinal direction in which the vibration arm portions 16a and 16b extend. Therefore, it is possible to increase the number of tuning-fork vibrating pieces per vibrating piece substrate 11.

In the vibrating piece substrate 11, the surface on which the thin films 35a and 35b serving as a weight is different from the surface on which the measurement pads 40a and 40b and the wiring lines 34a and 34b are formed. Thus, when radioactive rays are irradiated in forming the thin films 35a and 35b serving as a weight in the vibration arm portions 16a and 16b, there is no case where the probe 51 is affected by the radioactive rays. Therefore, it becomes possible to perform accurate measurement without damage to the probe 51 and it is possible to manufacture the tuning-fork vibrating pieces 12 with stable quality.

The invention is not limited to the above-described embodiment, and various modifications may be made without departing from the technical scope and spirit defined by the appended claims.

The entire disclosure of Japanese Patent Application No. 2010-020004, filed Feb. 1, 2010 is expressly incorporated by reference herein.

What is claimed is:

1. A vibrating piece substrate, comprising:
a first vibrating piece and a second vibrating piece adjacent to each other, each of the first and second vibrating pieces including:
a vibrating arm portion extending from a base, the vibrating arm portion including a first surface, a second surface opposite to the first surface, and a side surface that connects the first and second surfaces;
a first excitation electrode formed on each of the first surface and the second surface;
a second excitation electrode formed on the side surface, the second excitation electrode being electrically separated from the first excitation electrode; and
a first supporting arm portion and a second supporting arm portion that extend from the base in a longitudinal direction in a plan view; and
a frame, a portion of the frame being sandwiched between the vibrating arm portion of the first vibrating piece and the vibrating arm portion of the second vibrating piece;
wherein a first linking portion connects the first supporting arm portion of the second vibrating piece to the portion of the frame being sandwiched, and a second linking portion connects the second supporting arm portion of the first vibrating piece to the portion of the frame being sandwiched;
a first electrode pad and a second electrode pad are positioned next to each other in the longitudinal direction on the portion of the frame being sandwiched, the first and second electrode pads being electrically separated from each other;
a first wiring line electrically connects the first electrode pad and the first excitation electrode, the first wiring line being formed on the first linking portion; and
a second wiring line electrically connects the second electrode pad and the second excitation electrode, the second wiring line being formed on the second linking portion.

2. The vibrating piece substrate of claim 1, wherein a thin film serving as a weight is formed on one of the first surface and the second surface, and one of the first and second electrode pads and one of the first and second wiring lines are formed on the other of the first surface and the second surface.

3. A vibrating piece which is folded and cut off from the vibrating piece substrate of claim 1.

4. A vibrating piece which is folded and cut off from the vibrating piece substrate of claim 2.

5. The vibrating piece according to claim 3, wherein the supporting arm portions have a folded and cut mark.

6. The vibrating piece according to claim 4, wherein the supporting arm portions have a folded and cut mark.

* * * * *